US007889002B2

(12) United States Patent
Berkhout

(10) Patent No.: US 7,889,002 B2
(45) Date of Patent: Feb. 15, 2011

(54) POWER AMPLIFIER

(75) Inventor: Marco Berkhout, Tiel (NL)

(73) Assignee: NXP B.V., Eindhoven (NL)

( * ) Notice: Subject to any disclaimer, the term of this patent is extended or adjusted under 35 U.S.C. 154(b) by 116 days.

(21) Appl. No.: 12/446,150

(22) PCT Filed: Oct. 18, 2007

(86) PCT No.: PCT/IB2007/054242

§ 371 (c)(1), (2), (4) Date: Apr. 17, 2009

(87) PCT Pub. No.: WO2008/047323

PCT Pub. Date: Apr. 24, 2008

(65) Prior Publication Data

US 2010/0321111 A1 Dec. 23, 2010

(30) Foreign Application Priority Data

Oct. 20, 2006 (EP) .................................. 06122677
Oct. 18, 2007 (WO) ................. PCT/IB2007/054242

(51) Int. Cl.
*H03F 3/217* (2006.01)

(52) U.S. Cl. ...................................................... 330/251

(58) Field of Classification Search ................... 330/10, 330/207 A, 251

See application file for complete search history.

(56) References Cited

U.S. PATENT DOCUMENTS 5,502,632 A 3/1996 Warmerdam et al.
6,518,837 B2 * 2/2003 Berkhout ..................... 330/10
2005/0110556 A1 5/2005 Guedon
2005/0162228 A1 7/2005 Putzeys
2005/0168206 A1 8/2005 Nadd
2006/0017466 A1 1/2006 Bryon

FOREIGN PATENT DOCUMENTS

DE 10357537 A1 8/2005
EP 367006 A2 5/1990
EP 0751621 A 1/1997
EP 973250 A2 1/2000

* cited by examiner

*Primary Examiner*—Steven J Mottola

(57) ABSTRACT

The invention refers to a power amplifier comprising a first transistor ($M_H$) having a first main channel coupled between a positive power supply terminal ($V_{dd}$) and an output terminal ($V_{out}$), said first transistor having a control terminal driven by a first gate signal ($V_{gatehigh}$) provided by a high driver circuit, which is biased from a first voltage terminal ($V_{boot}$). The power amplifier further comprises a second transistor ($M_L$) having a second main channel coupled between the output terminal and a negative power supply terminal ($V_{ss}$), said second transistor having a second control terminal driven by a second gate signal ($V_{gatelow}$) provided by a low driver circuit, which is biased from a second voltage terminal ($V_{reg}$), and a switch circuit (10) coupled between the first voltage terminal ($V_{boot}$) and the second voltage terminal ($V_{reg}$), said switch circuit being controlled by the second gate Signal ($V_{gatelow}$).

7 Claims, 2 Drawing Sheets

Vdd
Vboot
Vgatehigh
10
inhigh
Cboot
MH
L
Vload
Vout
Vreg
Vgatelow
inlow
C
ML
Vss

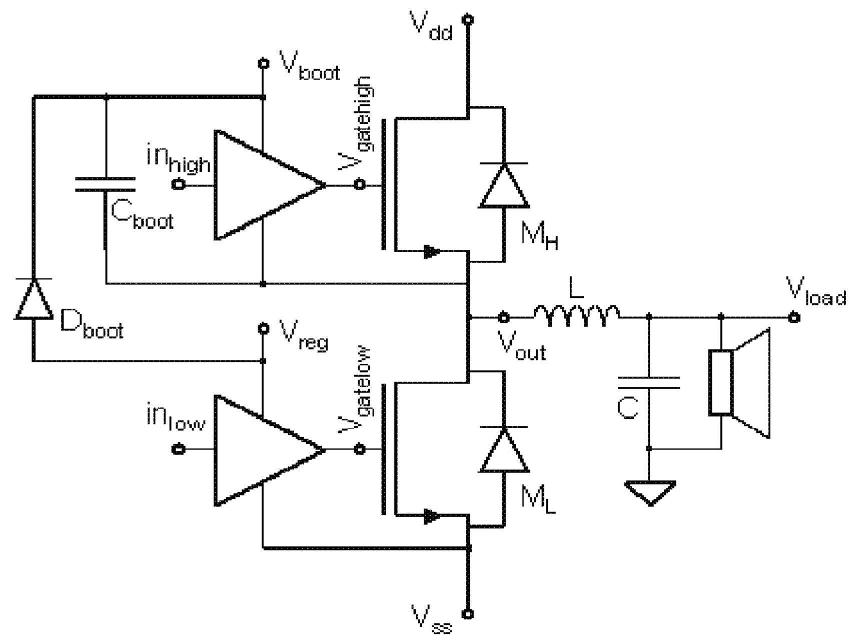
FIG. 1 - PRIOR ART
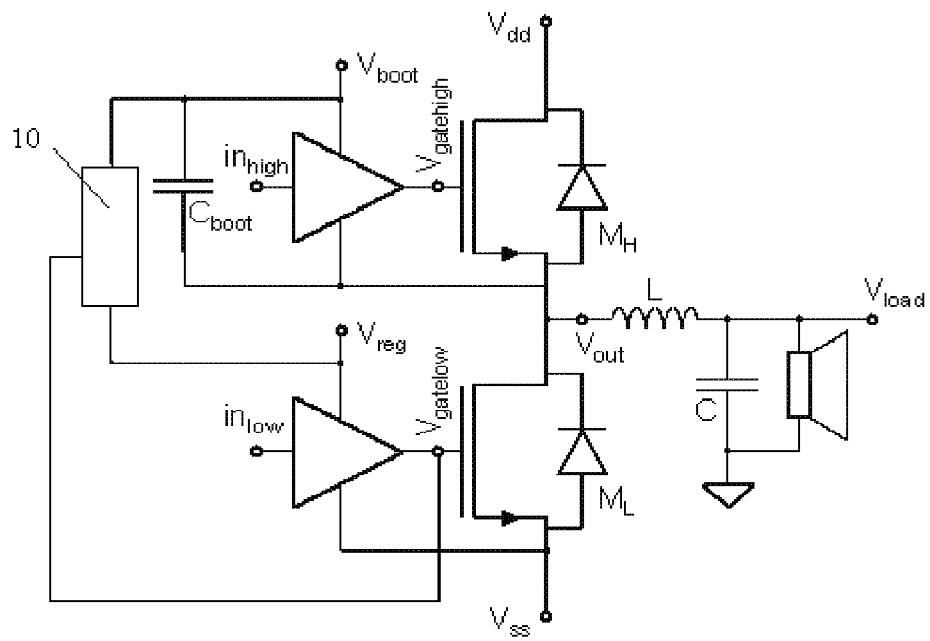
FIG. 2

POWER AMPLIFIER

FIELD OF THE INVENTION

The invention relates to a power amplifier.

BACKGROUND OF THE INVENTION

Normally a class-D amplifier comprises an output stage consisting of two n-type power MOSFETs in a totempole configuration as shown in FIG. 1. The output node $V_{out}$ is switched between the supply lines using some form of pulse-width modulation (PWM). An LC-lowpass filter is usually inserted between the output node $V_{out}$ and the loudspeaker load to filter out the high frequency content. A driver circuit that is supplied from a regulated source $V_{reg}$ controls the gate of the lowside power MOSFET $M_L$. This topology automatically limits the gate-source voltage of the power MOSFET. Another driver circuit controls the gate of the highside power MOSFET $M_H$. In order to switch ON the highside power MOSFET $M_H$ a gate voltage higher than the supply voltage $V_{dd}$ is needed. This voltage is created dynamically using a bootstrap capacitor $C_{boot}$. When the lowside power MOSFET $M_L$ is switched ON the output node $V_{out}$ is pulled down to the negative supply $V_{ss}$. The bootstrap capacitor $C_{boot}$ is charged through a bootstrap diode $D_{boot}$ connected between the regulated source $V_{reg}$ and a bootstrap voltage $V_{boot}$. When the highside power MOSFET $M_H$ is switched ON and the lowside is switched OFF, the output node $V_{out}$ is pulled up to the positive supply $V_{dd}$. Now the bootstrap diode $D_{boot}$ becomes reverse biased and the bootstrap capacitor $C_{boot}$ serves as a floating power supply for the highside driver. Usually, the highside driver has a moderate current consumption causing the voltage across the bootstrap capacitor $C_{boot}$ to decrease. However, each time the class-D power stage switches the bootstrap capacitor $C_{boot}$ is recharged. A disadvantage of the bootstrap configuration is that the voltage across the bootstrap capacitor $C_{boot}$ is always lower than the voltage of the regulated source $V_{reg}$ because of the inevitable voltage drop across the bootstrap diode $D_{boot}$. This voltage is typically 0.6V at room temperature but can increase to almost 1V at −40° C. A lower bootstrap voltage means less gate-source voltage for the highside power MOSFET $M_H$ and thus a higher $R_{on}$. Further, for optimal operation of a class-D power stage as shown in FIG. 1 it is desirable that the bootstrap voltage matches the voltage of the regulated source.

SUMMARY OF THE INVENTION

Hence, it is an object of the present invention to provide a power amplifier in which the above-mentioned problems are solved. The invention is defined by the independent claims. Dependent claims define advantageous embodiments.

This object is achieved a power amplifier comprising:

- a first transistor having a first main channel coupled between a positive power supply terminal and an output terminal, said first transistor having a control terminal driven by a first gate signal provided by a high driver circuit, which is biased from a first voltage terminal,
- a second transistor having a second main channel coupled between the output terminal and a negative power supply terminal, said second transistor having a second control terminal driven by a second gate signal provided by a low driver circuit, which is biased from a second voltage terminal, and
- a switch circuit coupled between the first voltage terminal and the second voltage terminal, said switch circuit being controlled by the second gate signal.

Hence, a switch circuit has replaced the diode. When the output node $V_{out}$ of the class-D stage is low the switch circuit is closed causing the bootstrap capacitor $C_{boot}$ to be (re) charged to a voltage very close to the regulated source $V_{reg}$. When the output node $V_{out}$ is high the switch $S_{boot}$ is opened allowing the bootstrap voltage to be lifted above the supply voltage $V_{dd}$. The signal used to control the switch is the same signal that is used to control the gate of the lowside power MOSFET $M_L$ allowing for a very simple implementation. When the gate of the lowside power MOSFET $M_L$ is high this means that the output node $V_{out}$ must be low and thus the switch circuit may be closed to (re)charge the bootstrap capacitor $C_{boot}$. When the gate of the lowside power MOSFET $M_L$ is discharged just prior to a rising edge at the output node $V_{out}$ this opens the switch circuit just in time to prevent current from flowing back from the bootstrap capacitor $C_{boot}$ to the regulated source $V_{reg}$.

In an embodiment of the invention the switch circuit comprises a third transistor having a third main channel coupled between the first voltage terminal and the second voltage terminal, said third transistor having a third gate terminal driven by an output of a latch circuit, which is controlled by the second gate signal. The latch circuit is advantageous because it maintains its logical levels i.e. its output voltages, stable as far as the control signals are stable, allowing a robust control of the transistor. The transistor acts as a switch having a relatively low ON resistance and therefore the large voltage drop on the bootstrap diode of the prior art is avoided. It may be further observed that instead of a transistor any suitable switch having a low ON resistance may be used as e.g. a MEMS switch. Preferably the transistor is a p-MOS one, but other suitable type of transistor may be used instead, as n-MOS, bi-polar, etc.

In another embodiment of the invention the latch circuit comprises a first inverter having a first inverter input coupled to the third gate terminal and a first inverter output coupled to an intermediate node, a second inverter having a second inverter input terminal coupled to the intermediate node and a second inverter output coupled to the third gate terminal. It should be emphasized that this is a relatively simple implementation of the latch circuit. Alternatively, controlled inverters or series combinations of transmission gates and inverters may be used, as a skilled person in the art is aware of. However, this embodiment is probably the simplest implementation of a latch suitable for the class D amplifier of the invention.

In another embodiment of the invention the latch circuit further comprises a fourth transistor having a fourth control terminal coupled to the output terminal and a fourth main channel coupled between the intermediate node the second gate signal for controlling a state of the latch circuit. Preferably the fourth transistor is a p-MOS transistor. Alternatively, n-MOS transistors, bipolar transistors or MEMS may be used instead.

BRIEF DESCRIPTION OF THE DRAWINGS

The above and other advantages will be apparent from the exemplary description of the accompanying drawings in which:

FIG. 1 depicts a typical class D power amplifier,

FIG. 2 depicts a class D amplifier according to the invention,

DETAILED DESCRIPTION OF EMBODIMENTS

FIG. 2 depicts a class D amplifier according to the invention. The power amplifier comprises:

a first transistor $M_H$ having a first main channel coupled between a positive power supply terminal $V_{dd}$ and an output terminal $V_{out}$, said first transistor having a control terminal driven by a first gate signal $V_{gatehigh}$ provided by a high driver circuit, which is biased from a first voltage terminal $V_{boot}$. The power amplifier further comprises a second transistor $M_L$ having a second main channel coupled between the output terminal and a negative power supply terminal $V_{ss}$, said second transistor having a second control terminal driven by a second gate signal $V_{gatelow}$ provided by a low driver circuit, which is biased from a second voltage terminal $V_{reg}$. The power amplifier further includes a switch circuit 10 coupled between the first voltage terminal $V_{boot}$ and the second voltage terminal $V_{reg}$, said switch circuit being controlled by the second gate signal $V_{gatelow}$. Hence, a switch circuit has replaced the diode. When the output node $V_{out}$ of the class-D stage is low the switch circuit is closed causing the bootstrap capacitor $C_{boot}$ to be (re) charged to a voltage very close to the regulated source $V_{reg}$. When the output node $V_{out}$ is high the switch $S_{boot}$ is opened allowing the bootstrap voltage to be lifted above the supply voltage $V_{dd}$. The signal used to control the switch is the same signal that is used to control the gate of the lowside power MOSFET $M_L$ allowing for a very simple implementation. When the gate of the lowside power MOSFET $M_L$ is high this means that the output node $V_{out}$ must be low and thus the switch circuit may be closed to (re)charge the bootstrap capacitor $C_{boot}$. When the gate of the lowside power MOSFET $M_L$ is discharged just prior to a rising edge at the output node $V_{out}$ this opens the switch circuit just in time to prevent current from flowing back from the bootstrap capacitor $C_{boot}$ to the regulated source $V_{reg}$.

Figure 3:
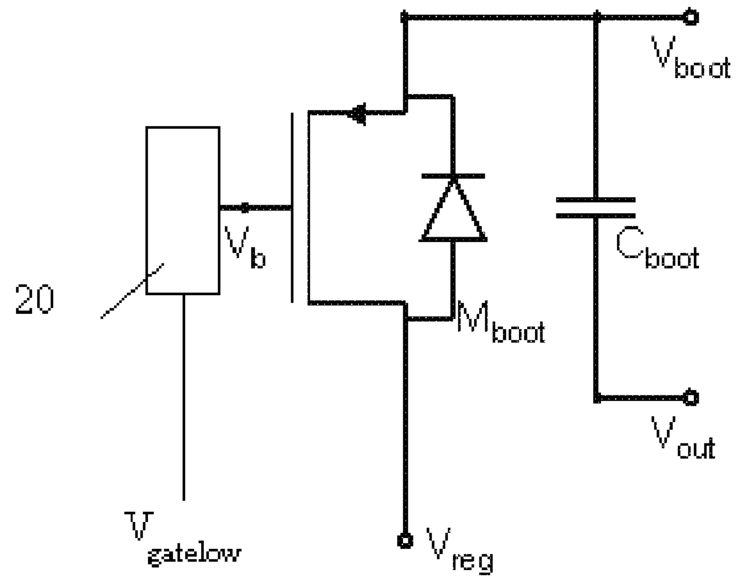
FIG. 3 depicts in more detail the switch circuit, according to an embodiment of the invention.

FIG. 3 depicts in more detail the switch circuit, according to an embodiment of the invention. The switch circuit 10 comprises a third transistor $M_{boot}$ having a third main channel coupled between the first voltage terminal $V_{boot}$ and the second voltage terminal $V_{reg}$, said third transistor $M_{boot}$ having a third gate terminal $V_b$ driven by an output of a latch circuit 20, which is controlled by the second gate signal $V_{gatelow}$. The latch circuit is advantageous because it maintains its logical levels i.e. its output voltages, stable as far as the control signals are stable, allowing a robust control of the transistor. The transistor acts as a switch having a relatively low ON resistance and therefore the large voltage drop on the bootstrap diode of the prior art is avoided. It may be further observed that instead of a transistor any suitable switch having a low ON resistance may be used as e.g. a MEMS switch. Preferably the transistor is a p-MOS one, but other suitable type of transistor may be used instead, as n-MOS, bi-polar, etc.

Figure 4:
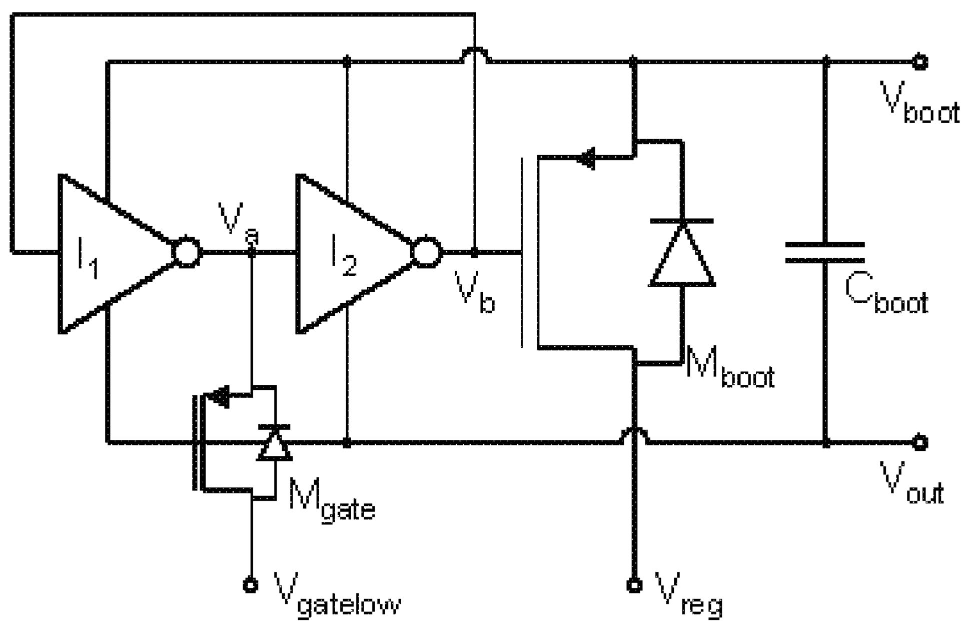
FIG. 4 depicts in more detail the switch circuit, according to another embodiment of the invention.

FIG. 4 depicts in more detail the switch circuit, according to another embodiment of the invention.

A single PMOS transistor $M_{boot}$ is used as switch. Using an NMOS switch is possible but a little bit more complicated since it would require the gate of the switch to be driven with a voltage higher than $V_{boot}$. The switch drive circuit consists of two inverters $I_1$ and $I_2$ and a transistor $M_{gate}$. The inverters $I_1$ and $I_2$ are connected in a loop to form a latch. This latch can be set or reset by the gate voltage $V_{gatelow}$ of the lowside power transistor $M_L$ through transistor $M_{gate}$. The function of $M_{gate}$ is to connect or disconnect the gate voltage $V_{gatelow}$ from the latch depending on the situation. First consider the case that the lowside power transistor $M_L$ is switched on. In this case the voltage at the output node $V_{out}$ is about equal to the negative supply $V_{ss}$, while the gate voltage $V_{gatelow}$ of the lowside power MOSFET $M_L$ is about equal to $V_{reg}$. Consequently, node Va will be pulled up through the backgate diode of transistor $M_{gate}$ and thus setting the latch formed by inverters $I_1$ and $I_2$ that further pulls up $V_a$ towards $V_{boot}$ and pulls down $V_b$ towards $V_{out}$. Now the gate of switch transistor $M_{boot}$ is at $V_{out}$ while the source is at $V_{boot}$ so the switch starts conducting as soon as the boot voltage exceeds the threshold voltage of $M_{boot}$. Note that the backgate diode of $M_{boot}$ allows current to flow from the regulated supply $V_{reg}$ towards $V_{boot}$ as well in exactly the same way as the original bootstrap diode. So the invention is actually an addition to the bootstrap diode. Now consider the case that a rising edge at the output $V_{out}$ is started. In this case the lowside power MOSFET is switched off and the gate voltage $V_{gatelow}$ is pulled down by the lowside gate drive circuit. Since node $V_a$ is pulled up to $V_{boot}$ by inverter I1 transistor $M_{gate}$ is conducting so pulling down the lowside gate $V_{gatelow}$ also pulls down node $V_a$. This in turn causes the latch to toggle. Node $V_a$ is pulled down towards $V_{out}$ thus switching off $M_{gate}$ and isolating the latch from $V_{gatelow}$. Node $V_b$ is pulled up towards $V_{boot}$ thus switching off $M_{boot}$. Now when the output node rises the latch formed by inverters $I_1$ and $I_2$ remains reset. This implementation yields a self-controlling switch that does not require any additional control signals. As such it can be applied in any switching power stage that uses n-type power MOSFETs in combination with a bootstrap capacitor. The invention may obviously be used in a power stage using only p-type power MOSFETs.

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. A power amplifier comprising:

a first transistor having a first main channel coupled between a positive power supply terminal and an output terminal, said first transistor having a control terminal driven by a first gate signal provided by a high driver circuit, which is biased from a first voltage terminal, a second transistor having a second main channel coupled between the output terminal and a negative power supply terminal, said second transistor having a second control terminal driven by a second gate signal provided by a low driver circuit, which is biased from a second voltage terminal, and a switch circuit coupled between the first voltage terminal and the second voltage terminal, said switch circuit being controlled by the second gate signal.

2. The power amplifier according to claim 1, further comprising a third transistor within the switch circuit having a third main channel coupled between the first voltage terminal and the second voltage terminal, said third transistor having a third gate terminal driven by an output of a latch circuit, which is controlled by the second gate signal.

3. The power amplifier according to claim 2, further comprising:

a first inverter having a first inverter input coupled to the third gate terminal and a first inverter output coupled to an intermediate node; and a second inverter having a second inverter input terminal coupled to the intermediate node and a second inverter output coupled to the third gate terminal, wherein the first and second inverters are within the latch circuit.

4. The power amplifier according to claim 3, further comprising:

a fourth transistor within the latch circuit having a fourth control terminal coupled to the output terminal and a fourth main channel coupled between the intermediate node and the second gate signal for controlling a state of the latch circuit.

5. The power amplifier according to claim 4, wherein the third transistor is a P-MOS transistor.

6. The power amplifier according to in claim 5 wherein the fourth transistor is a P-MOS transistor.

7. An integrated circuit comprising the power amplifier according to claim 6.

* * * * *